(12) United States Patent
Lerchenberger et al.

(10) Patent No.: US 8,309,390 B2
(45) Date of Patent: Nov. 13, 2012

(54) METHOD OF MANUFACTURING A PHOTOVOLTAIC DEVICE AND SYSTEM FOR PATTERNING AN OBJECT

(75) Inventors: August Lerchenberger, Dorfen (DE); Jorg Palm, Munich (DE)

(73) Assignee: Saint-Gobain Glass France, Courbevoie (FR)

(*) Notice: Subject to any disclaimer, the term of this patent is extended or adjusted under 35 U.S.C. 154(b) by 415 days.

(21) Appl. No.: 12/616,744

(22) Filed: Nov. 11, 2009

(65) Prior Publication Data
US 2010/0147384 A1    Jun. 17, 2010

(30) Foreign Application Priority Data
Dec. 16, 2008   (EP) .................................... 08171808

(51) Int. Cl.
*H01L 31/18*   (2006.01)
(52) U.S. Cl. .................. 438/85; 438/95; 257/E31.027
(58) Field of Classification Search ............. 257/E31.027
See application file for complete search history.

(56) References Cited

U.S. PATENT DOCUMENTS

| | | | |
|---|---|---|---|
| 5,626,688 | A | 5/1997 | Probst |
| 6,407,360 | B1 | 6/2002 | Choo |
| 2001/0035205 | A1 | 11/2001 | Kurata |
| 2006/0160261 | A1 | 7/2006 | Sheats |
| 2007/0232057 | A1 | 10/2007 | Borden |
| 2009/0032094 | A1 | 2/2009 | Aoki |

FOREIGN PATENT DOCUMENTS

| | | |
|---|---|---|
| DE | 112007000266 | 11/2008 |
| EP | 1544172 | 6/2005 |
| JP | 2007-201302 A * | 8/2007 |

OTHER PUBLICATIONS

EP Search Report for 08171808.2 filed on Dec. 16, 2008 in the name of Shell Erneuerbare Energien GmbH.
Jörg Palm et al, Second Generation CIS Solar Modules, Solar Energy, vol. 77, Issue 6, p. 757-765 (Dec. 2004) (Abstract Only).
V. Probst et al, Rapid CIS-Process for High Efficiency PV Modules: Development towards large area processing, Thin Solid Films, vol. 387, Issues 1-2, p. 262-267 (May 2001) (Abstract Only).

* cited by examiner

Primary Examiner — Stephen W Smoot
(74) Attorney, Agent, or Firm — Steinfl & Bruno LLP

(57) ABSTRACT

A method of manufacturing a photovoltaic device, which method comprises the steps of providing a first layer structure on an second layer structure so that the first layer structure has an external surface, and an interface with the second layer structure, the first layer structure comprising a thin-film photovoltaic absorber layer; patterning through the first layer structure from the external surface to or into the second layer structure by first mechanically removing material from the first layer structure in a predetermined patterning area, and subsequently removing, by means of laser cleaning, residual material from the mechanical removal in the patterning area; and a system for patterning an object having a first layer structure on an second layer structure, the system comprising a mechanical patterning device and a laser cleaning device, and means for relative movement between the object, and the mechanical patterning device and the laser cleaning device.

11 Claims, 3 Drawing Sheets

METHOD OF MANUFACTURING A PHOTOVOLTAIC DEVICE AND SYSTEM FOR PATTERNING AN OBJECT

CROSS REFERENCE TO RELATED APPLICATIONS

This application claims priority to European Patent Application 08171808.2, filed on Dec. 16, 2008, the disclosure of which is incorporated herein by reference in their entirety.

FIELD

The present disclosure relates to a method of manufacturing a photovoltaic device and to a photovoltaic device obtainable by that method.

BACKGROUND

Thin-film photovoltaic devices typically comprise a thin-film absorber layer structure sandwiched between front and back electrode layer structures. In the course of manufacturing such a device, pattering process steps are carried out, typically in order to achieve a separation of a large module area into individual cells while providing for an integrated electric series connection between these cells. Often, a structure of first patterning lines is referred to as P1 patterning and corresponds to a division of the back electrode layer into neighbouring parts. A structure of second patterning lines, P2 patterning, corresponds to an electrical connection between the front and back electrode layer structures, and the third patterning lines, P3, correspond to a separation into neighbouring parts of at least the front electrode layer.

A particular class of thin-film photovoltaic devices has an absorber layer formed of a group I-III-VI semiconductor, also referred to as a chalkopyrite semiconductor. Such a semiconductor is generally of the copper indium diselenide ("CIS") type, wherein this expression is to be understood such that indium can be partly or fully replaced by gallium and/or aluminium, and selenium can be partly or fully replaced by sulphur. CIS type semiconductors include those characterized by the formula $CuIn_xGa_yAl_{(1-x-y)}Se_zS_{(2-z)}$, wherein $x+y \leq 1$ and $z \leq 2$. Special cases of a CIS type layer are e.g. also denoted as CIGS or CIGSS. The CIS type layer can further comprise a low concentration, trace, or a doping concentration of one or more further elements or compounds, in particular alkali such as sodium, potassium, rubidium, caesium, and/or francium, or alkali compounds. The concentration of such further constituents is typically 5 wt % or less, preferably 3 wt % or less.

The CIS type layer is typically arranged on a back electrode of a metal film such as Mo. In a particular configuration the back electrode layer is supported by a substrate, typically soda-lime glass, but other substrates are possible as well. Preferably a diffusion barrier layer such as of silicon nitride or silicon oxide is arranged between the glass substrate and the back electrode.

The thin-film photovoltaic device is typically completed by depositing a buffer layer of e.g. cadmium sulphide on the CIS type layer, followed by one or more layers of a transparent metal oxide, often zinc oxide on which metal contacts are arranged. The top layer of the metal oxide is arranged to be an n-type semiconductor, e.g. by doping ZnO with boron or aluminium. The electrodes are provided with contacts or bus bars, and the cell is typically encapsulated and provided with a transparent front cover such as of glass.

An example of a manufacturing process of a CIS-type photovoltaic device is discussed in the paper "Rapid CIS-processing for high-efficiency PV-modules: development towards large area processing", V. Probst et al., Thin Solid Films vol. 387 (2001) p. 262-267, incorporated herein by reference in its entirety. In the known method, the P2 patterning is done by mechanical scribing.

In mechanical scribing, a scribing tool such as a sharpened and mechanically hardened stylus tip is run over a surface, in the case of a P2 patterning step to cut trenches through the absorber layer structure. Although mechanical scribing has proven to be a suitable technology, practical experience has shown that the final contact resistance between front and back electrode layers can vary significantly along the patterning lines.

Laser patterning, similar to what is already in use for the P1 patterning step, has been tried for P2 patterning as well, but did not provide reliable results. Laser patterning requires precise knowledge of the (local) physical parameters of the layer to be patterned, such as absorption depth, heat dissipation, and this turns out to be problematic with high reliability. When a relatively thick layer of the order of more than one micrometer is removed, the risk of cutting not deep enough, or in fact too deep into the underlying structure, is therefore significant.

SUMMARY

Embodiments of the present disclosure provide an improved method for patterning through a first layer structure to or into a second layer structure, and provide a thin-film photovoltaic device with improved properties.

According to an aspect of the present disclosure, a method of manufacturing a photovoltaic device, which method comprises the steps of providing an absorber layer structure on an electrode layer structure so that the absorber layer structure has an external surface, and an interface with the electrode layer structure, the absorber layer structure comprising a thin-film photovoltaic absorber layer and the electrode layer structure comprising an electrode layer;

patterning through the absorber layer structure from the external surface to at least the electrode layer by first mechanically removing material from the absorber layer structure in a predetermined patterning area, and subsequently removing, by means of laser cleaning, residual material covering the electrode layer in the patterning area.

The present disclosure is based on the insight that residual material, which is left in the trenches after mechanical scribing, is detrimental to the properties of the finished solar cell. The material left in the scribe lines after mechanical P2 patterning has an influence on the local contact resistance that is achieved at the respective location. Furthermore it has been found that the residual material can effectively be removed by a laser cleaning step subsequent to the mechanical scribing step. This additional cleaning step has proven not only to reduce the overall level of contact resistance and contact resistance variations, but also improved the stability under damp heat conditions of the final thin-film solar cells.

The present disclosure further provides a photovoltaic device comprising a patterned first layer structure comprising a thin-film absorber layer, and superimposed on a second layer structure, wherein the patterned first layer structure is obtainable by a method according to the disclosure.

BRIEF DESCRIPTION OF THE DRAWINGS

Embodiments of the present disclosure will now be described in more detail and with reference to the accompanying drawings, wherein.

Where the same reference numerals are used in different Figures, they refer to the same or similar objects.

DESCRIPTION OF EXAMPLE EMBODIMENTS

The expression 'layer structure' is used in the description and in the claims to refer to an arrangement of one or more stacked layers, one or more or all of which can be patterned. A layer structure can also be referred to as a layer arrangement.

In particular, the expression 'absorber layer structure' is used in the description and in the claims to refer to a structure of one or more layers including a photoactive thin-film absorber layer such as of CIS type; the expression 'back electrode layer structure' is used to refer to a structure of one or more layers including a conductive electrode layer such as a layer comprising or essentially consisting of molybdenum; and the expression 'front electrode layer structure' refers to a structure of one or more layers including a conductive electrode layer such as a layer comprising or essentially consisting of doped ZnO, in particular n-ZnO. The front electrode layer structure is suitably transparent as it faces the source of light during normal operation.

According to several embodiments, the present disclosure is particularly relevant for the P2 patterning step, serving for the electrical interconnection between the front electrode layer and the back electrode layer of adjacent cells. This patterning step is carried out when an absorber layer structure overlaying the back electrode layer structure has been formed. The absorber layer structure has an external surface and an interface with the back electrode layer structure. A pattern of P2 lines (trenches) has to be formed through the absorber layer structure to reach the back electrode layer. In a subsequent processing step, the front electrode layer structure is deposited on the absorber layer structure, and electrical connection of the front electrode to the back electrode occurs via the P2 patterning structure.

Embodiments of the present disclosure can also be useful for other patterning steps such as a P3 patterning step.

Figure 1:
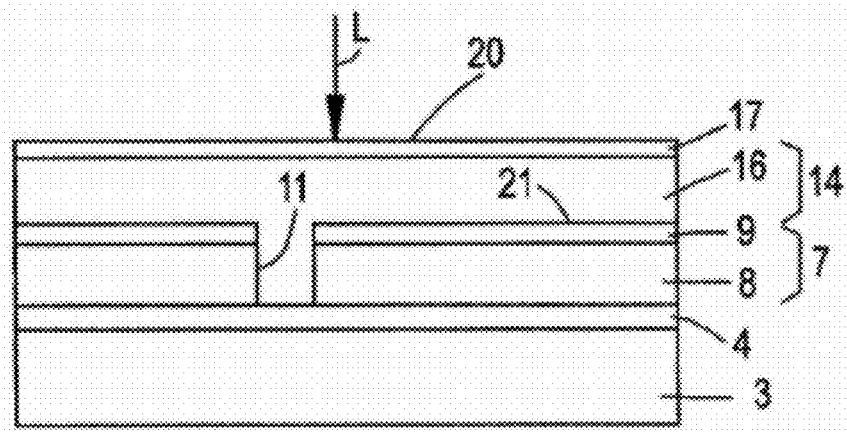
FIG. 1 shows schematically a cross-section through a semi-finished product in the course of manufacturing a thin-film photovoltaic device.

Reference is made to FIG. 1 showing schematically a cross-section through a semi-finished product 1 obtained in the course of manufacturing a thin-film photovoltaic device. On a substrate 3, typically from glass of about 1 to 3 millimeters thickness and coated with a diffusion barrier 4 layer such as silicon oxide or silicon nitride, a back electrode layer structure 7 is formed. In this embodiment, the back electrode layer structure 7 comprises a conducting back electrode layer 8 consisting of or containing molybdenum, and a top layer 9 the constitution of which will be discussed. The molybdenum layer 8 is typically deposited by sputtering to a thickness of about 0.2 to 2 microns, and the top layer 9 is formed during deposition of the absorber layer structure 14 on top of the molybdenum back electrode layer 8.

A P1 patterning line or trench 11 electrically separating areas of the back electrode layer structure is indicated in the Figure. P1 patterning can be done by a pulsed Nd-YAG laser.

The absorber layer structure 14 of this embodiment comprises absorber layer 16 and a buffer layer 17 of e.g. cadmium sulphide.

The absorber layer 16, typically a CIS type semiconductor layer of p-type, can be formed by any method available in the art. A preferred method includes sputter deposition of a sequence of layers comprising the metal constituents of the CIS layer, optionally depositing a Se layer by vapour deposition, followed by rapid thermal processing. A preferred process is described in J. Palm, V. Probst and F. H. Karg, "Second generation CIS solar modules" Solar Energy, vol. 77, p. 757-765, 2004, incorporated herein by reference in its entirety.

During deposition of the CIS layer, the Mo of the back electrode reacts with S and/or Se. The stoichiometry depends on the precise conditions, but in general terms this layer can be characterized as $Mo_x(S_z,Se_{1-z})_y$. In the further description, this will be abbreviated as Mo(S,Se).

The diffusion barrier layer 4 serves to suppress diffusion of alkali metals from the glass substrate into the CIS layer 16. Further, the CIS layer preferably contains a controlled amount of Na, as disclosed in U.S. Pat. No. 5,626,688, incorporated herein by reference in its entirety.

The buffer layer 17 can e.g. be of CdS but can also be a cadmium free layer, and deposited by any suitable technique such as chemical bath deposition or vapour deposition.

The absorber layer structure 14 superimposing the back electrode layer structure 7 has an external surface 20 and an interface 21 with the back electrode layer structure 7.

FIG. 1 represents a situation before a P2 patterning step, in which in a patterning area, such as along predetermined lines, indicated as arrow L, on the external surface 20, trenches are to be cut through the first layer structure which in this case is formed by the absorber layer structure 14, into the second layer structure, in this case formed by the back electrode layer structure 7.

Figure 2:
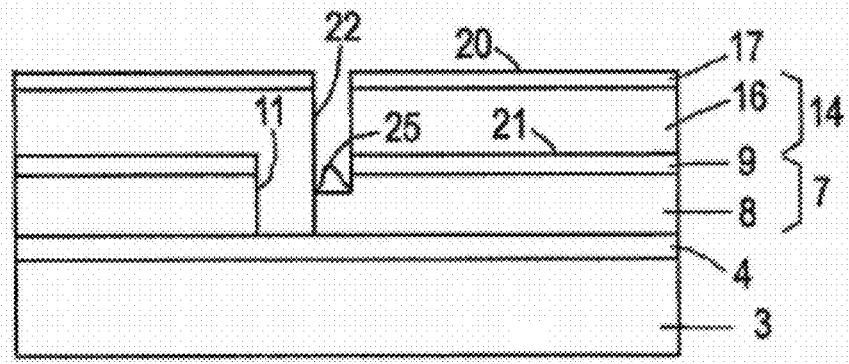
FIG. 2 shows the semi-finished product from FIG. 1 after a patterning step.

Reference is now made to FIG. 2, showing schematically the semi-finished product of FIG. 1 after such a P2 patterning step by mechanical scribing of the trench 22, extending from the external surface 20 through the absorber layer structure 14 to the electrode layer 7. In principle the cutting depth of the scribing tool is adjusted such that it cuts a small distance, e.g. 100 nm or less, into the Mo layer 8. However, some residual material 25 of Mo(S,Se) and/or CIS type material is left in the trenches. The mechanical properties of the absorber layer 16 and the thickness of the Mo(S,Se) layer are influenced by the process conditions of the absorber layer formation, such as selenization and sulphurization conditions. This makes it difficult to precisely control the mechanical scribing process, in particular the scribing force. The present disclosure allows for a decoupling of mechanical properties of the Mo/Mo(S, Se)/CIS type interface from the electrical properties of the resulting Mo/ZnO contact. The CIS is relatively brittle compared to the hard Mo back electrode layer, and the Mo(S,Se) layer due to is properties acts as a 'lubricant'. Mechanical scribing in the first step therefore can remove most of the material from the trenches, but some residual material is left.

In accordance with the embodiments of the disclosure, a laser cleaning step is used to remove residual material 25 from the trench 22. The laser beam properties are selected such that the residues of Mo(S,Se) and or CIS type material are removed without removing too much of the Mo layer 8. Since only a relatively small quantity of residual material needs to be removed by the laser, compared to attempting to scribe the entire trench by using only a laser, there is much better control and reliability of the process, and less dependency on local physical parameters. A removal of up to 100 nm in depth direction from the electrode layer structure below can be tolerable as the thickness and conductivity of the Mo layer is typically high enough to conduct the current across such a shallow trench in the back electrode along the P2 layer.

In this way, the beneficial properties of mechanical scribing and laser cleaning are optimally combined in the present disclosure. Mechanical scribing for bulk removal of thick layers (typically 1 µm or more) can be easier controlled than direct laser patterning, because it can make beneficial use of hardness differences in the various layers. Laser cleaning on the other hand can easily remove the much smaller amount of residual material left by mechanical scribing (typically less than 200 nm).

Any suitable laser can be used. A suitable laser is for example a pulsed Nd-YAG laser, but in comparison to the P1 patterning step the irradiation density and spot diameter are suitably varied by defocusing the beam and adjusting the travel speed relative to the surface. For a fixed pulse rate the variation of travel speed results in a variation of laser spot overlap. The parameters can suitably be adjusted by optical inspection with a microscope and by measuring topography using a depth profilometer. If the power is too low, no change can be observed. If the power is too high, the Mo develops cracks.

Figure 3:
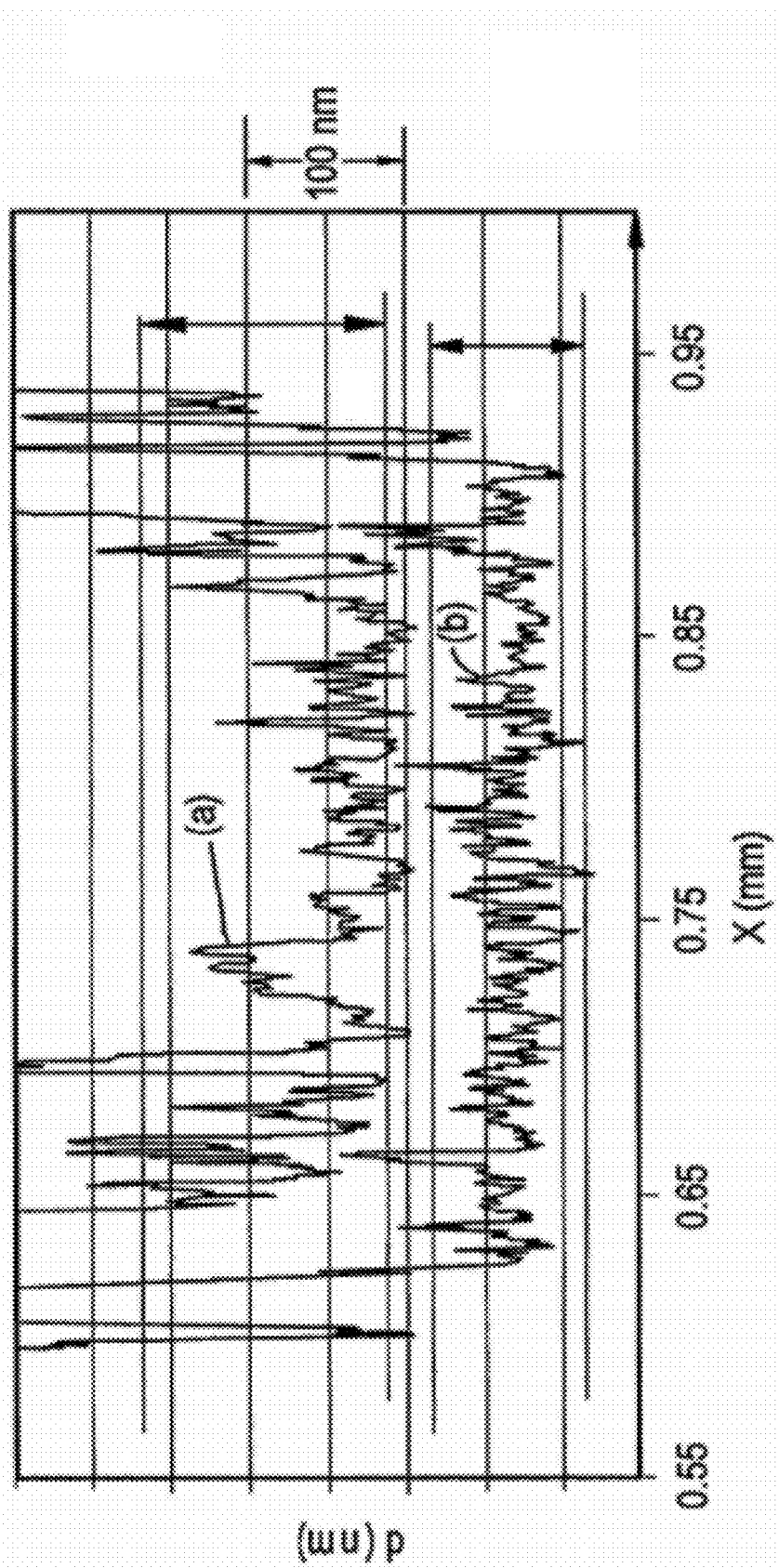
FIG. 3 shows an example of a profilometer scan within a P2 patterning line, with and without laser cleaning according to the disclosure.

Reference is made to FIG. 3, showing an example of depth profiles along a P2 patterning line (x-coordinate in mm against a selected reference point), obtained after mechanical scribing alone (a), and after mechanical scribing followed by laser cleaning (b). The depth profiles have been vertically shifted for the ease of reference, the absolute values of the depth are not of importance. The parallel lines and arrows indicate the roughness for each profile. It can be seen that the roughness of the profile b) is less than that of profile a). Also it can be seen that the profile (b) after laser cleaning is broader at the base, whereas after mechanical a significant amount of residue was left near the flanks of the trench.

The difference in roughness is also visible in an optical microscope. Also micro-Raman spectroscopy could prove the success of the laser cleaning. After mechanical scribing, a broad band of micro-Raman signals can be observed within the P2 trench, including for example spectral signatures of copper selenides. Such a broad band would not be observed on a clean Mo layer. After the additional laser cleaning step the signal intensity in the respective spectral range is strongly reduced.

Following the P2 patterning, typically a front electrode is deposited, wherein the P2 trenches allow electrical connection between front and back electrodes. Deposition of the front electrode can be done by any suitable method, such as sputtering or chemical vapour deposition. Preferably a ZnO based front electrode is used, and in particular the ZnO front electrode is advantageously formed by a DC magnetron sputtered, doped, such as boron or aluminium doped, ZnO layer, of e.g. between 500 and 1500 nm thickness. It can be advantageous to deposit a thin (10-100 nm) layer of intrinsic ZnO ("i-Zno", undoped, low conducting) on top of the buffer layer 9, before depositing the doped ZnO front electrode layer.

A problem with deposition of i-ZnO after the P2 patterning step is that the contact resistance between doped ZnO and the back electrode is higher. It was found that this is particularly a problem when the P2 patterning is done by mechanical scribing only. The laser cleaning step of the present disclosure improves the electrical contact to the back electrode layer 8 so much, that the slight increase in contact resistance due to deposition of the thin i-ZnO layer after the patterning can be tolerated. On the other hand, depositing both i-ZnO and doped ZnO layers after P2 patterning is a preferred process sequence, since both depositions can e.g. be done with the same sputtering equipment. If i-ZnO deposition after P2 patterning was not acceptable, this deposition would need to be done before the patterning, which adds complexity to the manufacturing process. In this case the absorber layer structure through which the P2 patterning step is conducted would comprise the absorber layer 8, buffer layer 9 and a top layer of i-ZnO (not shown in FIG. 2).

EXAMPLE

Reference is made to Table 1, showing the Fill Factor FF of CIS-type thin film solar modules (30×30 cm) that have been processed in four different ways:
(A) mechanical P2 patterning before i-ZnO deposition, and no laser cleaning after mechanical P2 scribing (not according to the disclosure);
(B) mechanical P2 patterning followed by laser cleaning before i-ZnO deposition (according to the disclosure);
(C) mechanical P2 patterning after i-ZnO deposition, and no laser cleaning after mechanical P2 scribing (not according to the disclosure); and
(D) mechanical P2 patterning followed by laser cleaning after i-ZnO deposition (according to the disclosure).

Other than for these differences, the modules were manufactured identically. For each type of processing, 5-6 modules were manufactured and the average fill factors are shown.

TABLE 1

| Sample type | FF (%) |
|---|---|
| A | 63.0 |
| B | 65.3 |
| C | 64.4 |
| D | 66.2 |

Clearly, laser cleaning leads to a significant improvement of the Fill Factor. The fill factor of the preferred processing sequence (B) with i-ZnO deposition after P2 patterning and according to the disclosure is in fact higher than the fill factor obtained without laser cleaning but with i-ZnO deposition before P2 patterning (C).

Figure 4:
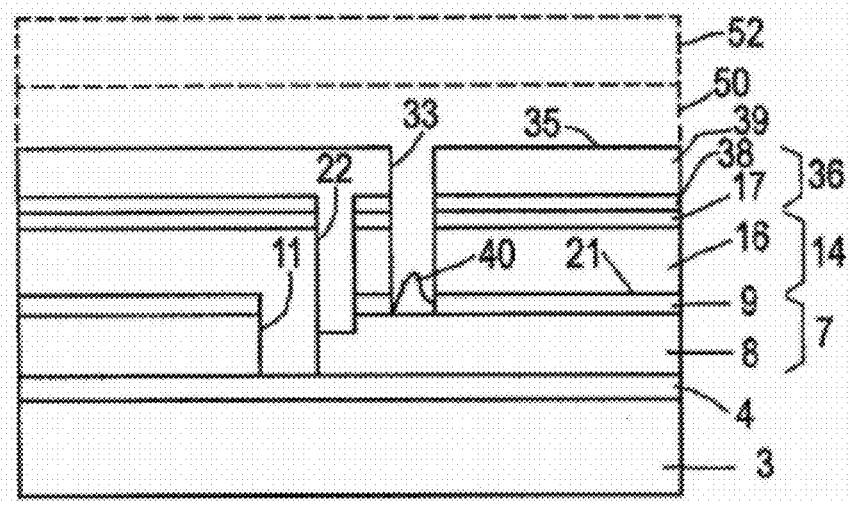
FIG. 4 shows the semi-finished product from FIG. 2 after further processing steps.

After the front electrode deposition, suitably a further patterning step, P3, is conducted in order to separate the front electrode into several adjacent areas. A P3 trench 33 is shown in FIG. 4. It extends from the external surface 35 of the front electrode layer structure 36 down through the absorber layer structure 14 to the back electrode layer 8. The front electrode layer structure 36 as shown in this example is formed of an i-ZnO layer 38 and a doped ZnO layer 39. It will be understood that the i-ZnO layer 34 can also be considered to form part of the absorber layer structure 14, in particular when it is deposited prior to P2 patterning.

The P3 patterning is conventionally also done by mechanical scribing. Also in this case, residual material 40 will remain in the P3 trenches 33. This material typically includes CIS type material. The residual material 40 can also be removed using a subsequent laser cleaning step in accordance with an embodiment of the present disclosure. The first layer structure is in this case formed by the combined electrode and absorber layer structures 36 and 14. In this case the use of the present disclosure will reduce the risk of shunting between adjacent cells, which can be caused by residue in the P3 trenches.

In a further step the thin-film photovoltaic device is provided with contact ribbons. In order to provide electrical contact with the back electrode, the layer structure covering the back electrode layer in the contact area, typically including the absorber layer, is conventionally removed with a mechanical process, using a brush, blade, spatula or the like. The contact area that is patterned in this way is again still covered with absorber layer residue, in particular Mo is covered with CIS type residue. Also at this manufacturing step the disclosure can be useful, so that the absorber residue is removed from the brushed contact area. Here again the contact resistance is reduced by the teachings according to some embodiments of the present disclosure. Furthermore, the mechanical adhesion of the contact ribbons to the back electrode is improved.

Figure 5:
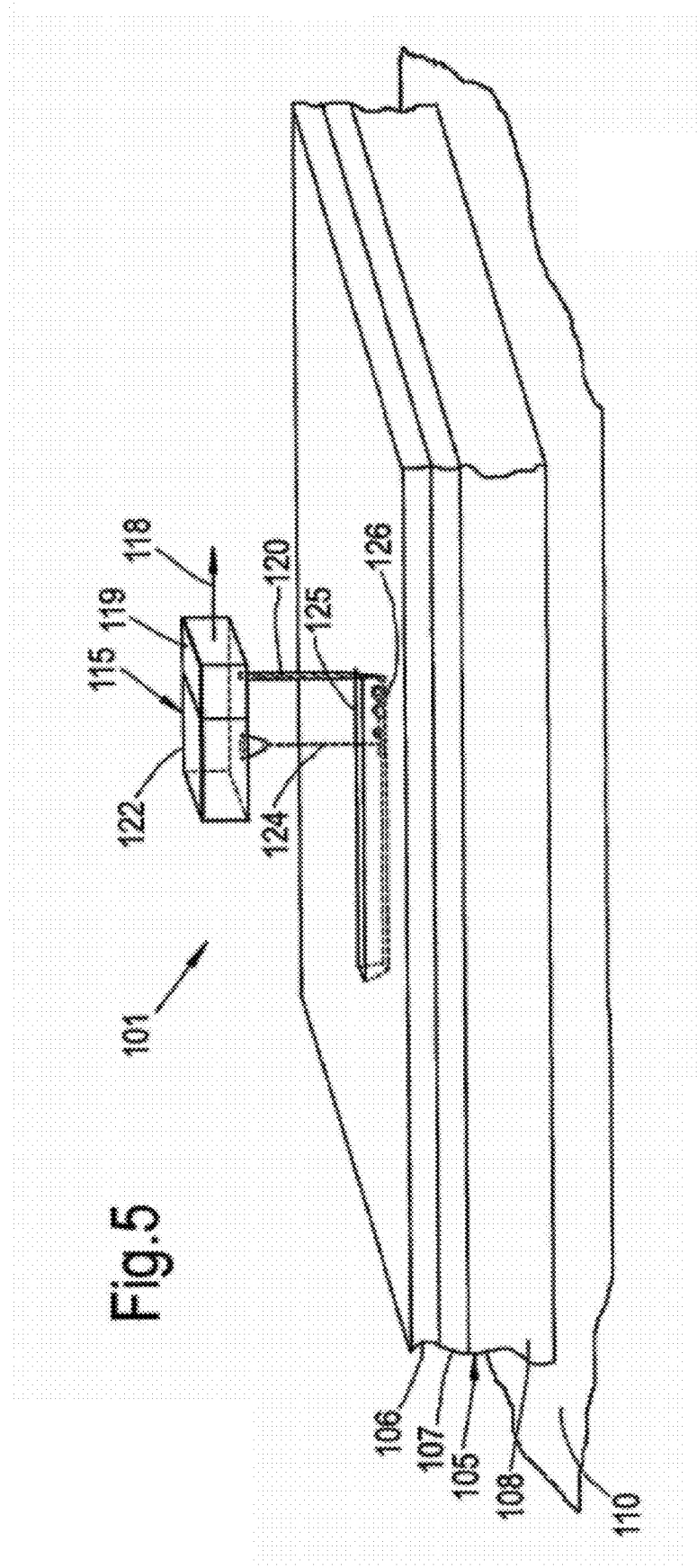
FIG. 5 shows schematically an embodiment of a system for patterning an object according to the disclosure.

After contacting, the thin-film photovoltaic device is completed, typically by encapsulation such as by laminating a transparent cover plate using a lamination polymer, e.g. such as ethylene-vinyl acetate (EVA) or polyvinyl butyral (PVB), onto the front electrode. Lamination polymer 50 and cover glass 52 are indicated in FIG. 5 as well.

According to some embodiments of the disclosure, the stability of the completed devices in damp heat conditions is improved. It is believed a partially reacted Mo/Mo(S,Se) surface with CIS type residues thereon has an increased corrosion tendency under damp heat conditions.

Usefulness of the teachings according to some embodiments of the present disclosure specifically for the lowered contact resistance of ZnO/Mo contacts via the P2 patterning structure, and the increased stability of these contacts against humidity stress, was demonstrated using interconnect test structures (ITS). Standard processing with mechanical P2 scribing only resulted in a contact resistance of 1-2 mOhm.cm$^2$. Using laser cleaning the contact resistance was reduced to 0.3 mOhm.cm$^2$. In an unencapsulated module, after being subjected to humidity stress for 700 hours (85% humidity at 85 degrees C.) the contact resistance of the uncleaned contacts increased to 48 mOhm.cm$^2$, and the contact resistance of the cleaned contacts to 1.2 mOhm.cm$^2$. Not only the absolute contact resistance is decreased, also the relative increase under damp heat conditions is significantly less.

Cleaning P3 trenches or contact areas as discussed hereinbefore is also useful under damp heat conditions. In this case not the contact resistance but rather the sheet resistance of the Mo is improved, since partially reacted Mo with CIS residue is thought to be more sensitive to corrosion under damp heat conditions.

Comparative experiments were conducted on the photovoltaic conversion efficiency of CIS type modules manufactured with and without the teachings of the present disclosure.

Reference devices manufactured with a conventional baseline process showed an efficiency of 11.9% (typical range 11.5% to 12.4%), whereas two circuits manufactured using laser cleaning for P2 trenches and otherwise manufactured identically both achieved an efficiency of 12.8%.

Embodiments of the present disclosure also provide a system for patterning an object having a first layer structure on an second layer structure, the system comprising a mechanical patterning device and a laser cleaning device, and means for relative movement between the object, and the mechanical patterning device and the laser cleaning device.

By way of example, an embodiment of such a system for patterning an object having a first layer structure on an second layer structure in accordance with an embodiment of the present disclosure is schematically shown in FIG. 5.

The object 105 comprises a first layer structure 106 overlaying a second layer structure 107, which is supported on a substrate 108. The substrate rests on a table 110. A patterning head 115 above the substrate is relatively moveable in a plane with respect to the table and the object thereon. To this end, either the table 110, or the patterning head 115, or both, can be moved. The head may also be movable towards and away from the table, between an operating position and a non-operating position, and/or for adjustment of the patterning. FIG. 5 shows a situation in which the patterning head has been operated while a relative distance with respect to the object 105 in the direction indicated by the arrow 118.

The patterning head includes a mechanical patterning device 119 comprising scribing tool 120, which includes a needle in this case. In addition, a laser cleaning device 122 is integrated in the patterning head, which is arranged so that a laser beam 124 can be produced in the trench 125 that was cut by the mechanical scribing tool. Residue 126 left in the trench after mechanical patterning can in this way efficiently be removed in a fully integrated process step, without requiring a new adjustment of the laser cleaning tool with respect to the object. Although such integration is preferred, it will be understood that in principle the mechanical patterning and laser cleaning can be carried out consecutively without using an integrated patterning head.

It is possible to provide a plurality of adjacent scribing tools (not shown) that are arranged to cut a plurality of parallel trenches simultaneously. The laser cleaning device in this case suitably also produces a plurality of laser beams following the respective scribing tools. For example, a single laser beam can be split accordingly.

For patterning the contact area in order to clean it before providing contact ribbons as discussed hereinbefore, the mechanical patterning tool can comprise a brush, blade, spatula or the like, instead of the needle shown in FIG. 5. The laser cleaning device is then arranged so that it can clean a broader area than in case of a trench.

Accordingly, what has been shown are a method of manufacturing a photovoltaic device and a system for patterning an object. While the method and system have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

The invention claimed is:

1. A method of manufacturing a photovoltaic device, which method comprises the steps of
providing a first layer structure on a second layer structure so that the first layer structure has an external surface, and an interface with the second layer structure, the first layer structure comprising a thin-film photovoltaic absorber layer; and
patterning through the first layer structure from the external surface to or into the second layer structure by first mechanically removing material from the first layer structure in a predetermined patterning area, and subsequently removing, by way of laser cleaning, residual material from the mechanical removal in the patterning area.

2. The method according to claim 1, wherein the thin-film photovoltaic absorber layer is a chalcopyrite semiconductor.

3. The method of claim 2, wherein the chalcopyrite semiconductor is a copper indium diselenide type semiconductor.

4. The method according to claim 1, wherein the second layer structure is an electrode layer structure comprising an electrode layer.

5. The method of claim 4, wherein the electrode layer structure is a back electrode layer structure comprising a back electrode layer, and wherein patterning serves to uncover the electrode layer in the patterning area.

6. The method according to claim 5, wherein the back electrode layer comprises Mo.

7. The method according to claim 4, wherein the electrode layer comprises Mo.

8. The method according to claim 4, wherein the electrode layer structure comprises a layer of $Mo_x(S_z,Se_{1-z})_y$ at the interface with the first layer structure.

9. The method according to claim 1, wherein a laser utilized for laser cleaning removes residue up to 100 nm in depth direction from the second layer structure.

10. A method of manufacturing a photovoltaic device, which method comprises the steps of providing a first layer structure on a second layer structure so that the first layer structure has an external surface, and an interface with the second layer structure, wherein the first layer structure is selected between an absorber layer structure, a front electrode layer structure, and a combined absorber layer and front electrode layer structure; and patterning through the first layer structure from the external surface to or into the second layer structure by first mechanically removing material from the first layer structure in a predetermined patterning area, and subsequently removing, by way of laser cleaning, residual material from the mechanical removal in the patterning area.

11. The method according to claim 10, wherein a laser utilized for laser cleaning removes residue up to 100 nm in depth direction from the second layer structure.

* * * * *